United States Patent
Kim et al.

(10) Patent No.: US 7,596,029 B2
(45) Date of Patent: Sep. 29, 2009

(54) FLASH MEMORY DEVICE INCLUDING UNIFIED OSCILLATION CIRCUIT AND METHOD OF OPERATING THE DEVICE

(75) Inventors: Jin-Kook Kim, Gunpo-si (KR); Jin-Yub Lee, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 11/782,746

(22) Filed: Jul. 25, 2007

(65) Prior Publication Data

US 2008/0055996 A1 Mar. 6, 2008

(30) Foreign Application Priority Data

Sep. 6, 2006 (KR) .................. 10-2006-0085454

(51) Int. Cl.
*G11C 16/06* (2006.01)

(52) U.S. Cl. .................. 365/185.18; 365/233.11; 365/189.09; 365/189.07; 365/230.08

(58) Field of Classification Search ............ 365/185.18, 365/233.11, 189.09, 189.07, 230.08
See application file for complete search history.

(56) References Cited

U.S. PATENT DOCUMENTS

| | | | | |
|---|---|---|---|---|
| 5,278,792 A | * | 1/1994 | Inoue et al. | 365/193 |
| 2005/0057995 A1 | * | 3/2005 | Mitani et al. | 365/222 |
| 2005/0135183 A1 | * | 6/2005 | Kondo | 365/233 |
| 2005/0207229 A1 | | 9/2005 | Takeuchi | |

FOREIGN PATENT DOCUMENTS

| | | |
|---|---|---|
| JP | 2004303327 | 10/2004 |
| JP | 2005267821 | 9/2005 |
| KR | 1020060022161 A | 3/2006 |
| KR | 1020060058068 A | 5/2006 |

* cited by examiner

*Primary Examiner*—Thong Q Le
(74) *Attorney, Agent, or Firm*—Volentine & Whitt, PLLC

(57) ABSTRACT

Embodiments of the present invention provide a flash memory device with a unified oscillation circuit, and a method of operating the device. The unified oscillation circuit produces alternative internal clock signals for corresponding alternative operating modes of the flash memory device. At least a portion of the unified oscillation circuit is used to generate all of the alternative internal clock signals. Compared to conventional memory devices and methods that use multiple oscillators, embodiments of the invention improve circuit density and reduce the incidence of timing glitches caused by switching between multiple oscillators.

20 Claims, 8 Drawing Sheets

US 7,596,029 B2

FLASH MEMORY DEVICE INCLUDING UNIFIED OSCILLATION CIRCUIT AND METHOD OF OPERATING THE DEVICE

BACKGROUND OF THE INVENTION

1. Field of the Invention

The present invention relates to a semiconductor memory device, and more particularly, to a flash memory device.

This application claims the benefit of Korean Patent Application No. 10-2006-0085454, filed on Sep. 6, 2006, in the Korean Intellectual Property Office, the disclosure of which is incorporated herein in its entirety by reference.

2. Description of Related Art

Generally, flash memory devices have three main operating modes, i.e., a program mode, an erase mode, and a read mode. The cycle of an internal clock signal, which is required in an internal circuit of a flash memory device, is different according to an operating mode. Conventional flash memory devices include separate oscillation circuits for the respective operating modes in order to generate internal clock signals having different cycles according to the operating modes.

Meanwhile, flash memory devices need high voltage to erase and program data and thus include a high-voltage generator therewithin to generate the high voltage. The high-voltage generator includes a plurality of charge pumps connected in series. Each charge pump generates high voltage by performing pumping in response to an oscillation signal. This oscillation signal is also generated by an internal oscillation circuit included within a flash memory device.

FIG. 1 is a schematic block diagram of a conventional oscillation circuit 20. Referring to FIG. 1, the conventional oscillation circuit 20 includes separate oscillators (or OSC) 21, 22, and 23 for the read mode, the program (or PGM) mode, and the erase (or ERS) mode, respectively. The conventional oscillation circuit 20 also includes a switching circuit 24 to select one of oscillation signals CLK1, CLK2, and CLK3 respectively output from the oscillators 21, 22, and 23 and to provide an internal oscillation signal LCLK.

FIG. 2 is a circuit diagram of the oscillator 21 illustrated in FIG. 1. Referring to FIG. 2, the conventional oscillator 21 includes a reference voltage generator 310, a first comparison signal generator 320, and a second comparison signal generator 330, and a latch 340.

The reference voltage generator 310 includes a PMOS transistor P1 controlled by an enable signal EN, first and second resistors R1 and R2, and an NMOS transistor to generate a reference voltage Vref having a predetermined voltage level.

The first comparison signal generator 320 includes a detector and a comparator 321. The detector includes a PMOS transistor P2, two NMOS transistors N2 and N3, and a capacitor C1, which are sequentially connected in series between a power supply voltage VDD and a ground voltage VSS. The PMOS transistor P2 and the NMOS transistor N2 are turned on or off by a feedback signal S1 and the NMOS transistor N3 is turned on or off by the reference voltage Vref. The comparator 321 compares the reference voltage Vref with a detection signal V1 and outputs a comparison signal V3 corresponding to a result of the comparison.

The second comparison signal generator 330 has the same structure as the first comparison signal generator 320 and compares the reference voltage Vref with a detection signal V2 so as to output a comparison signal V4 as a result of the comparison.

The latch 340 includes two NAND gates 341 and 342 to generate first and second feedback signals S1 and S2. The second feedback signal S2 is output as an oscillation signal CLK1.

In conventional flash memory devices, an oscillation circuit includes the oscillator having the structure illustrated in FIG. 2 for each of the read, program, and erase modes. The cycle of an internal clock signal is adjusted in each mode by selecting one of oscillation signals output from the oscillators corresponding to the respective modes. Although it is possible to adjust the cycle according to an operating mode, oscillators need to be switched when the operating mode is changed At the moment of switching of two oscillators, the cycle of the internal clock signal may unexpectedly change or a glitch may occur.

SUMMARY OF THE INVENTION

Embodiments of the present invention provide a flash memory device with a unified oscillation circuit, and a method of operating the device. The unified oscillation circuit produces alternative internal clock signals for corresponding alternative operating modes of the flash memory device. At least a portion of the unified oscillation circuit is used to generate all of the alternative internal clock signals. Compared to conventional memory devices and methods that use multiple oscillators, embodiments of the invention improve circuit density and reduce the incidence of timing glitches caused by switching between multiple oscillators.

According to some embodiments of the present invention, there is provided a flash memory device including a memory cell array including electrically erasable programmable read-only memory (EEPROM) cells; a peripheral circuit coupled to the memory cell array and configured to perform program, erase, or read with respect to the memory cell array; a control circuit coupled to the peripheral circuit and configured to detect an operating mode based on an external control signal, the control circuit further configured to control the peripheral circuit according to the detected operating mode, and to generate a cycle control signal; and a unified oscillation circuit coupled to the control circuit and configured to generate a reference voltage that changes amplitude according to the cycle control signal, configured to generate a plurality of comparison signals that have different cycles respectively based on the cycle control signal and the reference voltage, and configured to generate a plurality of internal clock signals based on the comparison signals.

According to other embodiments of the present invention, there is provided a method of operating a flash memory device. The method includes detecting one of a plurality of operating modes based on an external control signal; generating a cycle control signal according to the detected one of the plurality of operating modes; and generating an internal clock signal according to the cycle control signal and wherein generating the internal clock signal comprises; generating a reference voltage that changes amplitude according to the cycle control signal; generating a plurality of comparison signals that have different cycles respectively based on the cycle control signal and the reference voltage; and generating the internal clock signal based on the comparison signals.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
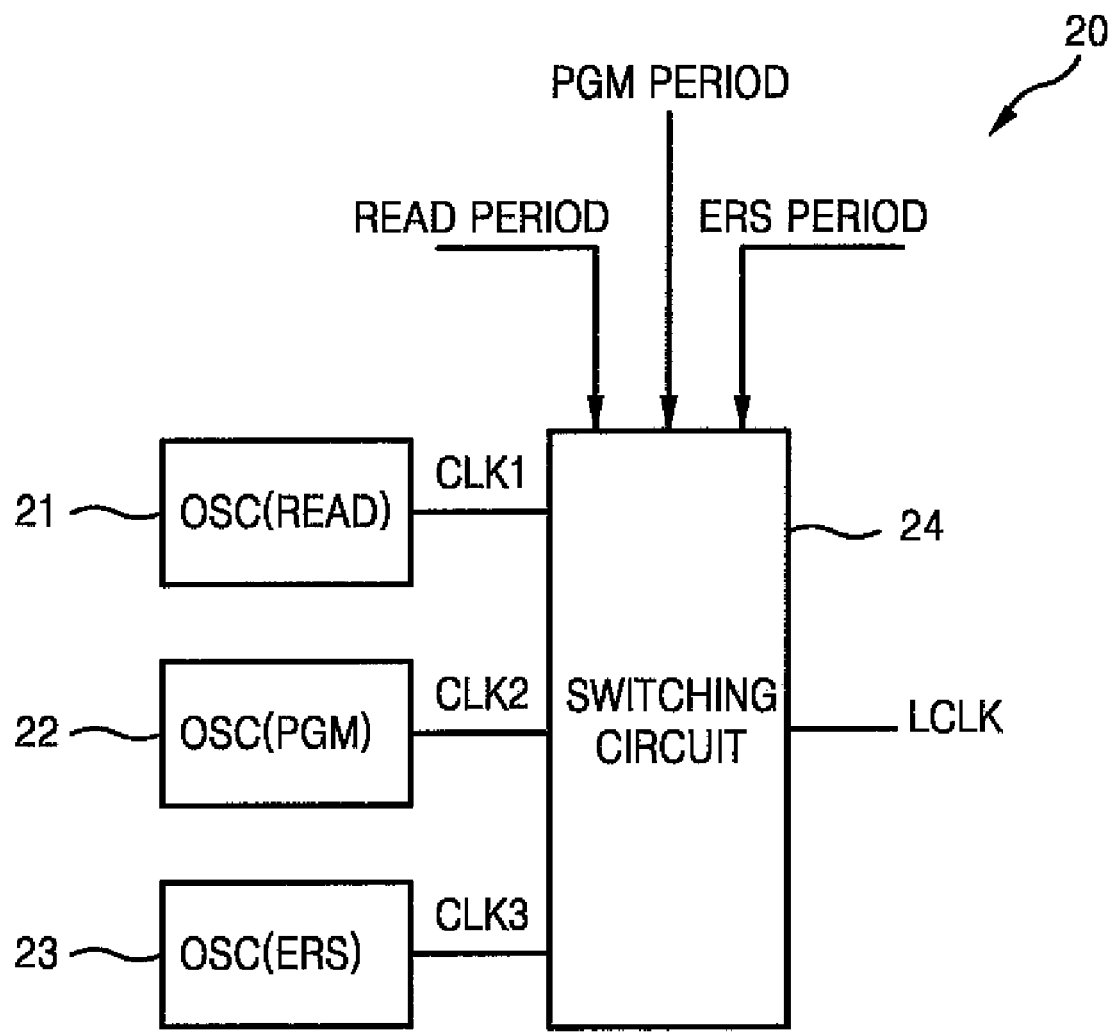
FIG. 1 is a schematic block diagram of a conventional oscillation circuit.
Figure 2:
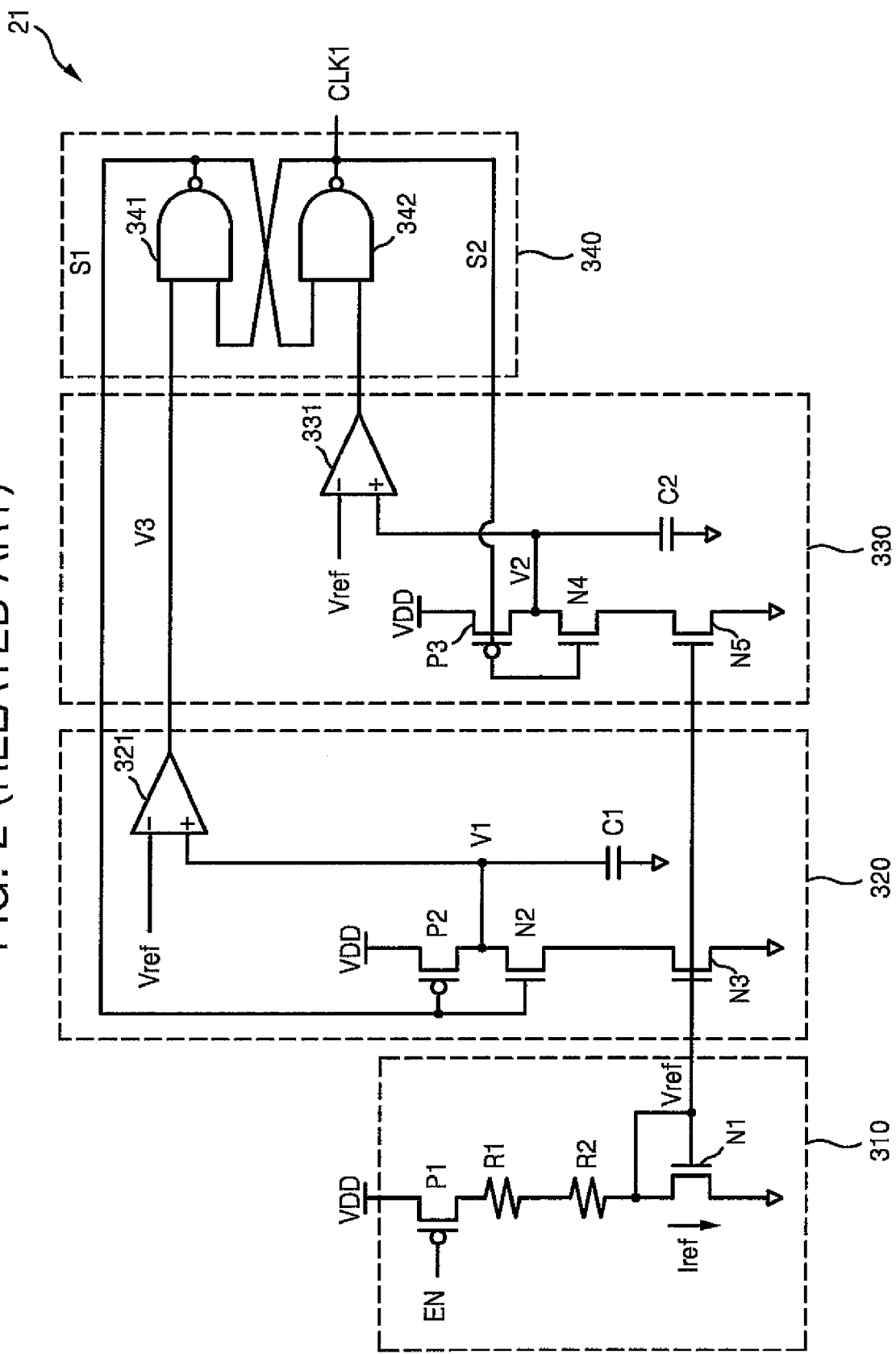
FIG. 2 is a circuit diagram of a conventional oscillator.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3:
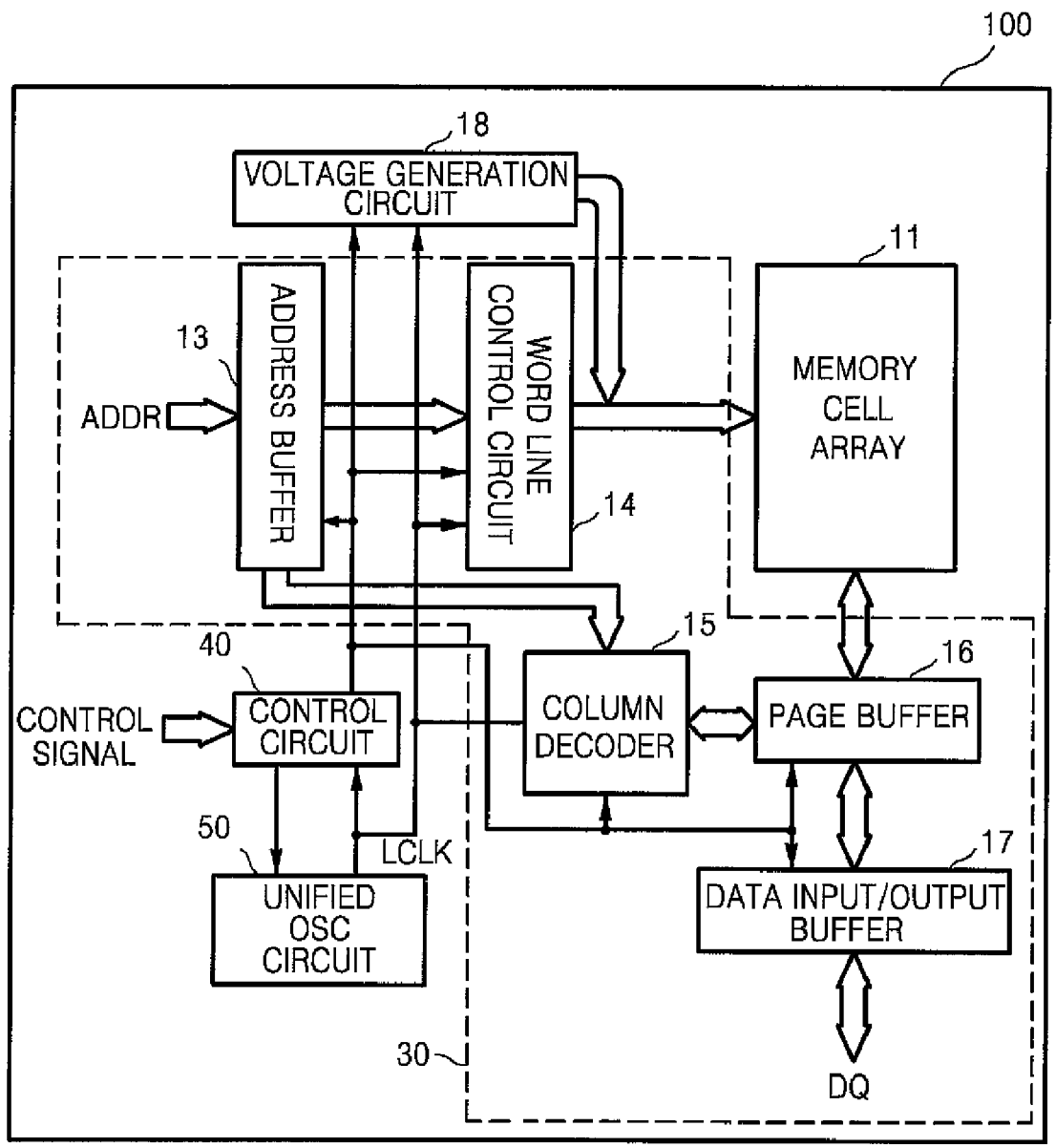
FIG. 3 is a schematic block diagram of a flash memory device according to some embodiments of the present invention.

FIG. 3 is a schematic block diagram of a flash memory device 100 according to some embodiments of the present invention. Referring to FIG. 3, the flash memory device 100 includes a memory cell array 11, an address buffer 13, a word line control circuit 14, a column decoder 15, a page buffer 16, a data input/output buffer 17, a voltage generation circuit 18, a control circuit 40, and a unified oscillation circuit 50.

The memory cell array 11 includes an electrically erasable programmable read-only memory (EEPROM) cells. For example, the memory cell array 11 may include a NAND cell string (not shown) which includes a plurality of memory cells connected in series and two selection transistors respectively connected to both ends of the series of memory cells.

The address buffer 13 buffers an address signal ADDR.

The word line control circuit 14 controls the voltage level of a plurality of word lines within the memory cell array 11 based on an operating mode (a program, an erase or a read mode) and a row address signal output from the address buffer 13. For this operation, the word line control circuit 14 may include a row address decoder (not shown) and a word line driver (not shown).

Voltages applied to the plurality of word lines within the memory cell array 11 are generated by the voltage generation circuit 18. The voltage generation circuit 18 generates the voltages, e.g., a program voltage, an erase voltage, a read voltage, and a pass voltage, which are applied to the word lines according to an operating mode. The program voltage and the erase voltage are high voltages and the voltage generation circuit 18 may generate the high voltages through charge pumping using a predetermined oscillation signal. The oscillation signal may be generated by the unified oscillation circuit 50, which will be described later.

The page buffer 16 temporarily stores read data and/or write data.

The column decoder 15 selects a column of the memory cell array 11 based on a column address signal output from the address buffer 13. Data read from the memory cell array 11 is output out of the flash memory device 100 via the page buffer 16 and the data input/output buffer 17.

The control circuit 40 detects a command and an operating mode based on externally input control signals. The control circuit 40 controls peripheral circuits 30 within the flash memory device 100 based on the detected command and operating mode. The peripheral circuits 30 are internal logic circuits needed to program, erase, and read data. The peripheral circuits 30 include the address buffer 13, the word line control circuit 14, the column decoder 15, the page buffer 16, and the data input/output buffer 17. Other circuits may be included in the peripheral circuits 30. The peripheral circuits 30 operate based on an internal clock signal LCLK output from the unified oscillation circuit 50.

The unified oscillation circuit 50 generates the internal clock signal LCLK and is controlled by the control circuit 40. As used herein, a unified oscillation circuit refers to a single oscillation circuit that is configured to selectively output any one of multiple differing clock signals. At least a portion of the components that comprise the unified oscillation circuit 50 are used to output each of the multiple differing clock signals, as will be described below.

Figure 4:
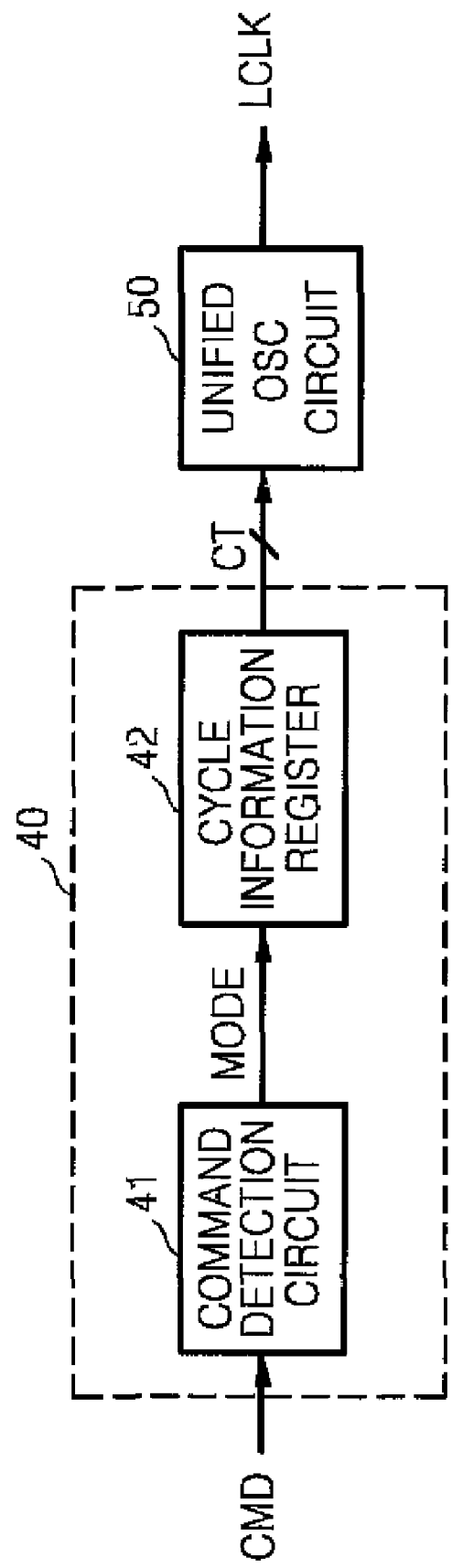
FIG. 4 is a schematic block diagram of a control circuit and an oscillation circuit according to some embodiments of the present invention.

FIG. 4 is a schematic block diagram of the control circuit 40 and the unified oscillation circuit 50 according to some embodiments of the present invention. Referring to FIG. 4, the control circuit 40 includes a command detection circuit 41 coupled to a cycle information register 42.

The command detection circuit 41 detects a command and an operating mode according to externally input control signals and generates a mode signal MODE indicating the operating mode. The cycle information register 42 stores cycle control information for each operating mode. For instance, the cycle information register 42 may store the cycle control information for each operating mode in response to a signal, which is applied externally at the power-up or the reset of the flash memory device 100. The cycle information register 42 also outputs a cycle control signal CT based on the cycle control information for a current mode in response to the mode signal MODE. The cycle control signal CT may be a digital signal comprised of a plurality of bits, e.g., signal bits CT<0>, CT<1>, and CT<3> as described below.

The control circuit 40 is coupled to the unified oscillation circuit 50. The unified oscillation circuit 50 generates the internal clock signal LCLK, which has a different cycle according to the operating mode, in response to the cycle control signal CT.

Figure 5:
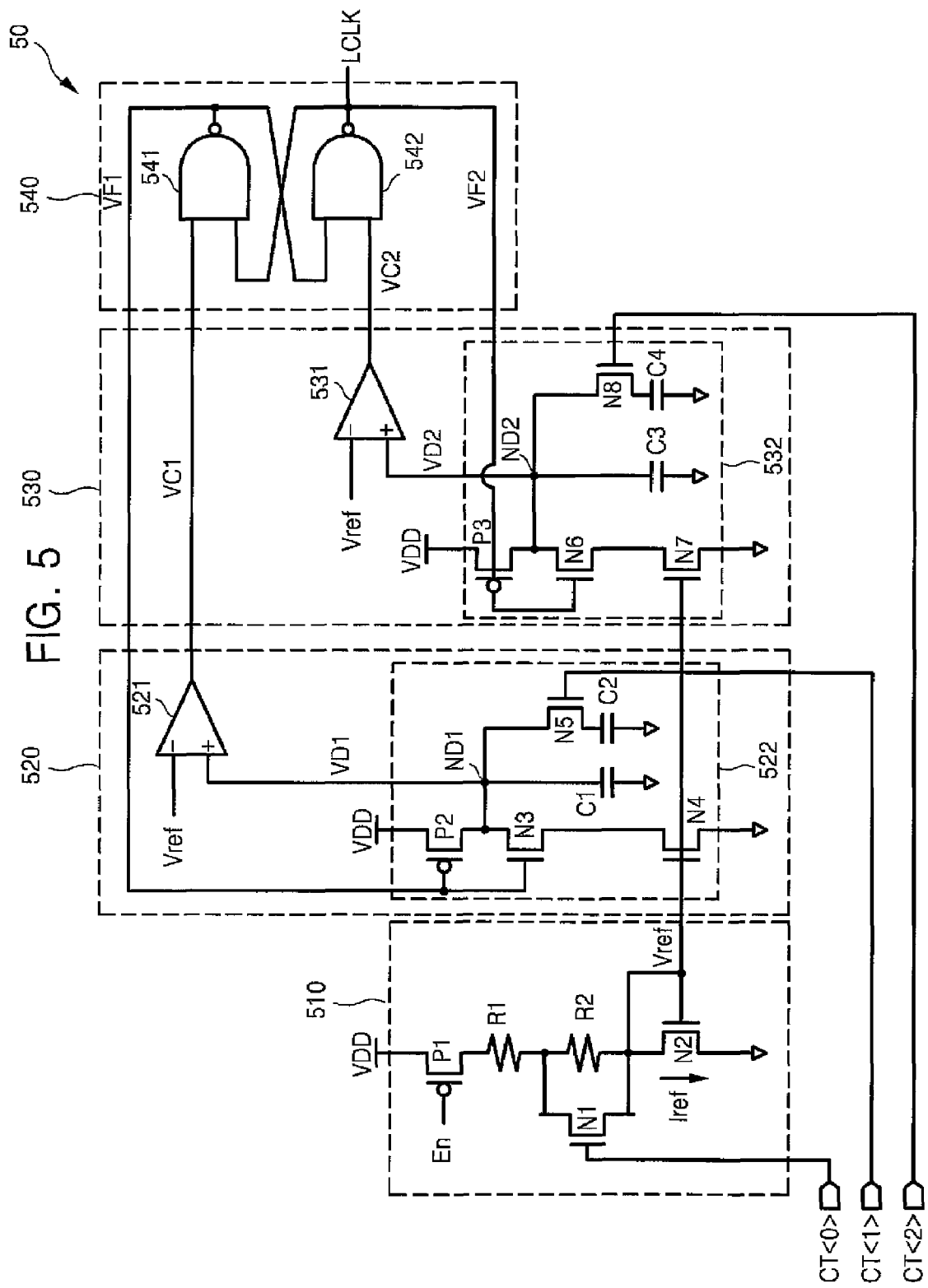
FIG. 5 is a circuit diagram of a unified oscillation circuit according to some embodiments of the present invention.

FIG. 5 is a detailed circuit diagram of the unified oscillation circuit (or OSC) 50 according to some embodiments of the present invention. Referring to FIGS. 4 and 5, the unified oscillation circuit 50 includes a reference voltage generator 510, a first slope controller 520, a second slope controller 530, and a latch 540.

The reference voltage generator 510 includes a first PMOS transistor P1, a first resistor R1, a second resistor R2, a first NMOS transistor N1, and a second NMOS transistor N2. The first PMOS transistor P1 is turned on or off in response an enable signal EN. The enable signal EN is a signal for enabling or disabling the unified oscillation circuit 50 and may be generated by the control signal 40.

The first and second resistors R1 and R2 are connected in series between a drain of the first PMOS transistor P1 and a drain of the second NMOS transistor N2. The first NMOS transistor N1 is connected to the second resistor R2 in parallel and is turned on or off in response to a first cycle control signal CT<0>Accordingly, when the first NMOS transistor N1 is turned on, the second resistor R2 does not operate and only the first resistor R1 exists in an electrical path between the drain of the first PMOS transistor P1 and the drain of the second NMOS transistor N2. Accordingly, turning the first NMOS transistor N1 on or off changes the level of a reference voltage Vref. If the reference voltage Vref is constant at a first reference level while the first NMOS transistor N1 is turned on, the reference voltage Vref is constant at a second reference level while the first NMOS transistor N1 is turned off.

The second NMOS transistor N2 has a drain and a gate, which are connected to each other, and generates the reference voltage Vref.

The first and second slope controllers 520 and 530 respectively include first and second comparators 521 and 531 and first and second detectors 522 and 532.

The first detector 522 receives a first feedback signal VF1 fed back from the latch 540, the reference voltage Vref, and a second cycle control signal CT<1> and outputs a first detection signal VD1 having a variable voltage level or a variable slope according to the received signals. The first detector 522 includes a second PMOS transistor P2 and third and fourth NMOS transistors N3 and N4, which are connected in series between a power supply voltage VDD and a ground voltage.

The second PMOS transistor P2 is connected between the power supply voltage VDD and a first node ND1 and is turned on or off in response to the first feedback signal VF1 from the latch 540. The third and fourth NMOS transistors N3 and N4 are controlled in response to the first feedback signal VF1 and the reference voltage Vref, respectively.

The first detector 522 also includes a first capacitor C1, which is connected between the first node ND1 and the ground voltage, and a fifth NMOS transistor N5 and a second capacitor C2, which are connected in series between the first node ND1 and the ground voltage. The fifth NMOS transistor N5 is turned on or off in response to the second cycle control signal CT<1> so as to function as a switch, which selectively connects the second capacitor C2 between the first node ND1 and the ground voltage. Accordingly, when the fifth NMOS transistor N5 is turned off, only the first capacitor C1 exists in the electrical path between the first node ND1 and the ground voltage. As a result, turning the fifth NMOS transistor N5 on or off changes capacitance in the first detector 522, thereby changing the slope of the first detection signal VD1.

The first comparator 521 may be implemented by a differential amplifier. The first comparator 521 compares the reference voltage Vref with the first detection signal VD1 and outputs a first comparison signal VC1 corresponding to a result of the comparison.

The second detector 532 receives a second feedback signal VF2 fed back from the latch 540, the reference voltage Vref, and a third cycle control signal CT<2> and outputs a second detection signal VD2 having a variable voltage level or a variable slope according to the received signals. The third PMOS transistor P3, the sixth NMOS transistor N6, and the seventh NMOS transistor N7 are coupled in series between supply VDD and a ground voltage. A third capacitor C3 is coupled between a second node ND2 and the ground voltage. An eighth NMOS transistor N8 and fourth capacitor C4 are coupled in series between the second node ND2 and the ground voltage. The slope of the second detection signal VD2 changes according to the state of NMOS transistor N8, that is, according to connection or disconnection of capacitor C4 between the second node ND2 and the ground voltage.

The second comparator 531 compares the reference voltage Vref with the second detection signal VD2 and outputs a second comparison signal VC2 corresponding to a result of the comparison.

The latch 540 may be implemented by a set-reset (SR) latch including two NAND gates 541 and 542. Outputs of the respective NAND gates 541 and 542 are respectively fed back to the first and second detectors 522 and 532 as the first and second feedback signals VF1 and VF2. The second feedback signal VF2 is also used as an output signal of the unified oscillation circuit 50, i.e., the internal clock signal LCLK.

As described above, the reference voltage generator 510 has a variable resistance value in response to the first cycle control signal CT<0>, so that the reference voltage Vref also changes. In addition, since the first and second slope controllers 520 and 530 have variable capacitance values in response to the second and third cycle control signals CT<1> and CT<2>, respectively, the slopes of the first and second detection signals VD1 and VD2 also change. Accordingly, the cycles of the first and second comparison signals VC1 and VC2 also change. As a result, the cycle of the internal clock signal LCLK varies with the cycle control signal CT. According to some embodiments of the present invention, the first, second and third cycle control signals CT<0>, CT<1>, and CT<2> are 1-bit signals in the cycle control signal CT, but the present invention is not restricted to these embodiments.

As described above, according to some embodiments of the present invention, the unified oscillation circuit 50 adjusts the cycle of the internal clock signal LCLK according to the cycle control signal CT. Accordingly, when different cycle control signals are used according to different operating modes of the flash memory device 100, the internal clock signal LCLK having a cycle appropriate for each operating mode can be obtained. Cycle control information or a cycle control signal, which is appropriate for each operating mode, can be obtained through simulations or tests of the flash memory device 100. The obtained cycle control information may be stored in the cycle information register 42 shown in FIG. 4.

Figure 6:
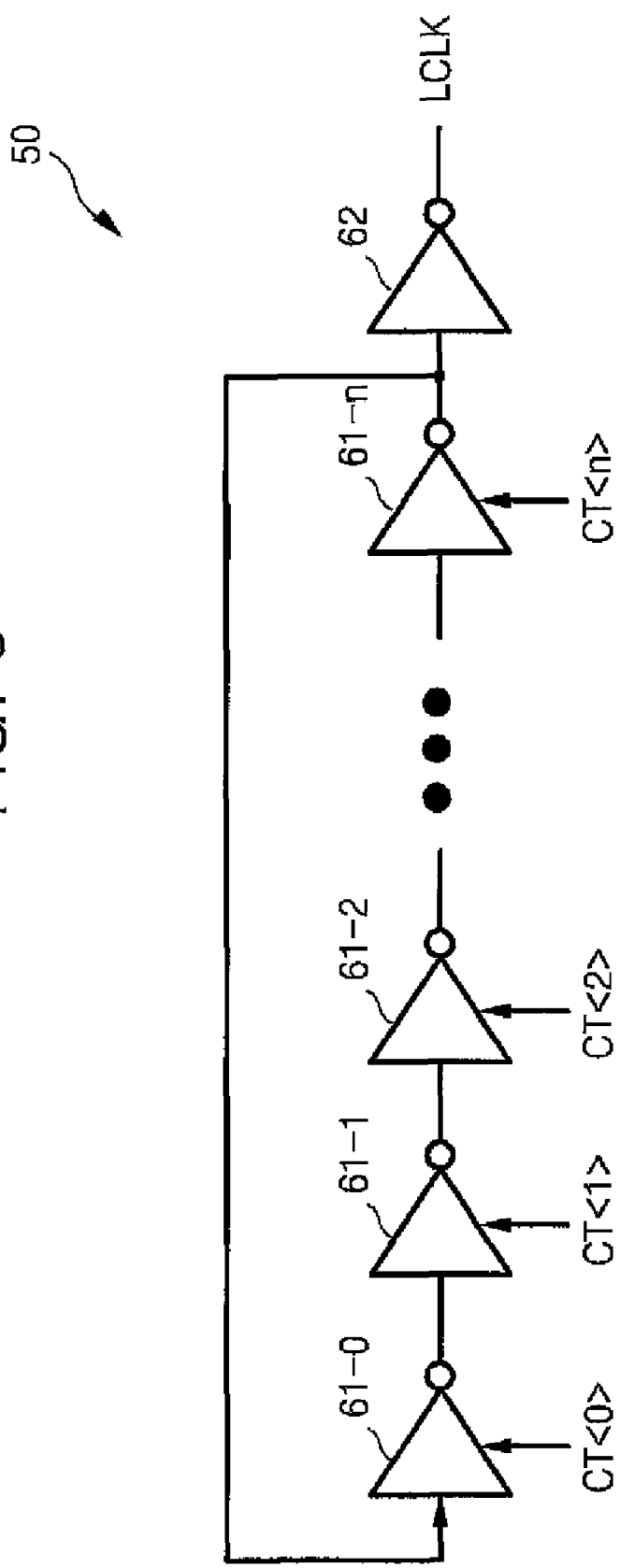
FIG. 6 is a circuit diagram of a unified oscillation circuit according to other embodiments of the present invention.

FIG. 6 is a circuit diagram of a unified oscillation circuit 50 according to other embodiments of the present invention.

Referring to FIG. 6, the unified oscillation circuit 50 is a ring oscillator and includes n+1 number of delay elements 61-0 through 61-n, which are connected in series. An output signal of the (n+1)-th delay element 61-n is fed back to the first delay element 61-0 as an input signal. The unified oscillation circuit 50 may also include an inverter 62 connected in series to the (n+1)-th delay element 61-n. Here, n+1 may be 3 or an odd number greater than 3.

At least one of the n+1 delay elements 61-0 through 61-n is controlled by the cycle control signal CT. According to some embodiments of the present invention, the n+1 delay elements 61-0 through 61-n are controlled in response to cycle control signals CT<0> through CT<n>, respectively, so that the cycle of the internal clock signal LCLK generated by the ring oscillator changes according to the cycle control signals CT<0> through CT<n>.

Figure 7A:
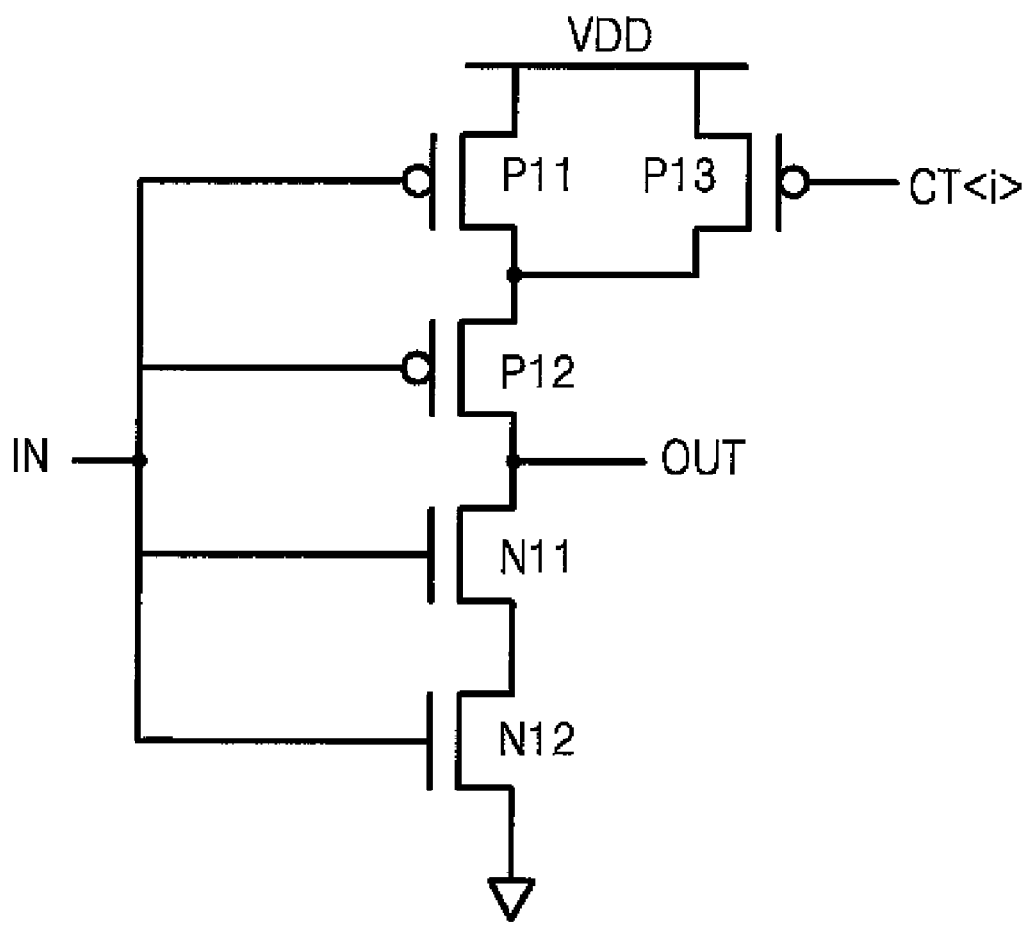
FIG. 7A is a circuit diagram of a delay element illustrated in FIG. 6, according to some embodiments of the present invention.
Figure 7B:
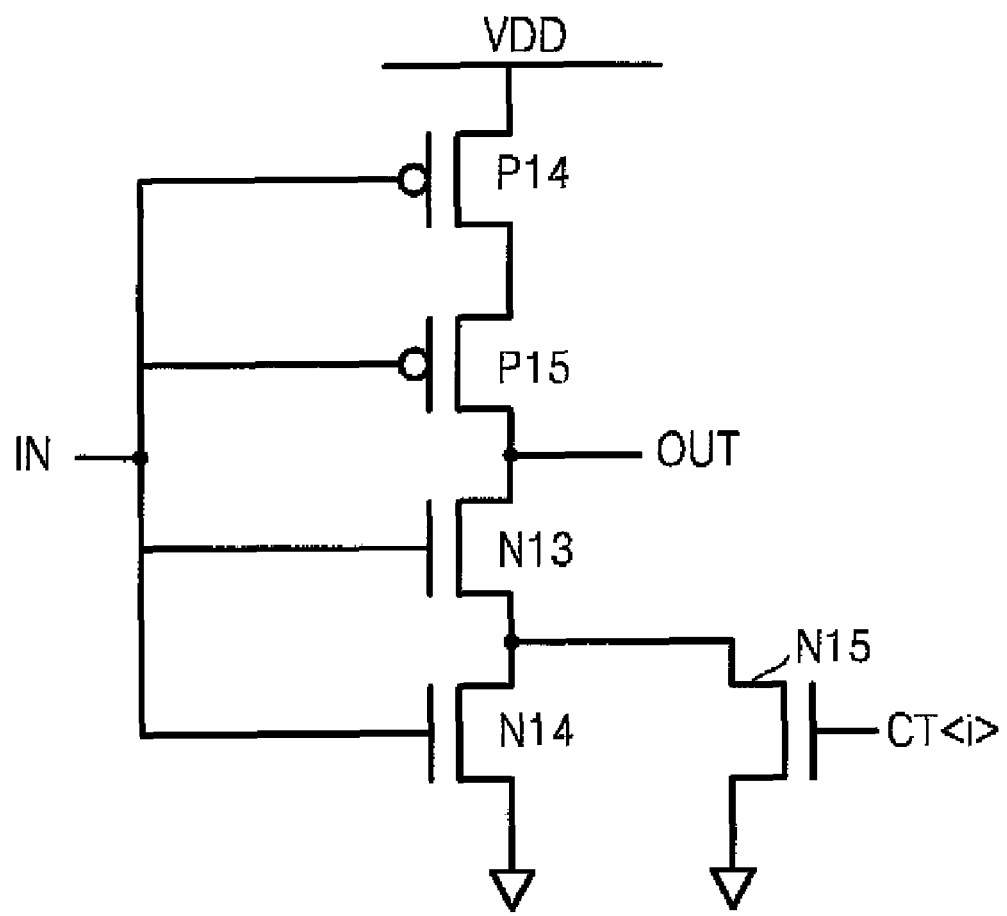
FIG. 7B is a circuit diagram of a delay element illustrated in FIG. 6, according to other embodiments of the present invention.

FIGS. 7A and 7B are circuit diagrams of a delay element 61-i illustrated in FIG. 6, according to some embodiments of the present invention. Referring to FIG. 7A, the delay element 61-i (where i=0~n) may include first and second PMOS transistors P11 and P12 and first and second NMOS transistors N11 and N12, which are all connected in series between a power supply voltage VDD and a ground voltage and controlled by an input signal IN. The delay element 61-i further includes and a third PMOS transistor P13, which is connected in parallel with the first PMOS transistor P11 and controlled in response to the cycle control signal CT<i> (where i=0~n).

Referring to FIG. 7B, a delay element 61-i (where i=0~n) may include first and second PMOS transistors P14 and P15 and first and second NMOS transistors N13 and N14, which are all connected in series between a power supply voltage VDD and a ground voltage and controlled by an input signal IN. The delay element 61-i further includes a third NMOS transistor N15, which is connected in parallel with the second NMOS transistor N14 and is controlled in response to the cycle control signal CT<i> (where i=0~n).

As described above, according to some embodiments of the present invention, oscillators provided for respective operating modes in a conventional flash memory device are unified into a single oscillator regardless of the operating modes, so that circuit area and power consumption can be reduced. In addition, according to some embodiments of the present invention, cycle control signals for the respective operating modes are applied to the unified oscillator so that an oscillation signal having a cycle appropriate for each operating mode can be obtained. The cycle can be simply adjusted by changing the cycle control signal. Furthermore, a glitch or an unexpected cycle change, which may occur in an internal clock signal due to switching between two oscillators at the change of an operating mode in conventional flash memory devices, can be prevented.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A flash memory device comprising:
   a memory cell array including electrically erasable programmable read-only memory (EEPROM) cells;
   a peripheral circuit coupled to the memory cell array and configured to perform program, erase, or read with respect to the memory cell array;
   a control circuit coupled to the peripheral circuit and configured to detect an operating mode based on an external control signal, the control circuit further configured to control the peripheral circuit according to the detected operating mode, and to generate a cycle control signal; and
   a unified oscillation circuit coupled to the control circuit and configured to generate a reference voltage that changes amplitude according to the cycle control signal, to generate a plurality of comparison signals that have different cycles respectively based on the cycle control signal and the reference voltage, and to generate a plurality of internal clock signals based on the comparison signals.

2. The flash memory device of claim 1, wherein the peripheral circuit includes an address buffer, a word line control circuit, a column decoder, a page buffer, and a data input/output buffer.

3. The flash memory device of claim 1, wherein at least a portion of the unified oscillation circuit is used to generate each of the plurality of internal clock signals.

4. The flash memory device of claim 1, wherein the operating mode is one of a program mode, an erase mode, and a read mode.

5. The flash memory device of claim 1, wherein the control circuit includes:
   a command detection circuit configured to generate a mode signal indicating the detected operating mode; and
   a cycle information register circuit coupled to the command detection circuit and configured to store cycle control information for each operating mode and to generate the cycle control signal based on cycle control information of an operating mode corresponding to the mode signal.

6. The flash memory device of claim 1, wherein the cycle control signal is a digital signal comprising a plurality of bits.

7. The flash memory device of claim 6, wherein the unified oscillation circuit includes:
   a reference voltage generator configured to generate the reference voltage that changes amplitude according to a first cycle control signal;
   a first detector coupled to the reference voltage generator and configured to output a first detection signal, the first detection signal based on a first feedback signal, the reference voltage, and a second cycle control signal;
   a second detector coupled to the reference voltage generator and configured to output a second detection signal, the second detection signal based on a second feedback signal, the reference voltage, and a third cycle control signal, the second feedback signal having a reverse phase with respect to the first feedback signal;
   a first comparator coupled to the first detector and configured to compare the reference voltage with the first detection signal and output a first comparison signal;
   a second comparator coupled to the second detector and configured to compare the reference voltage with the second detection signal and output a second comparison signal; and
   a latch coupled to the first comparator and the second comparator, the latch configured to receive the first comparison signal and the second comparison signal and generate the first and second feedback signals and the plurality of internal clock signals, wherein each of the first, second and third cycle control signals include at least one bit of the digital signal.

8. The flash memory device of claim 7, wherein the reference voltage generator has a resistance value that is configured to change in response to the first cycle control signal.

9. The flash memory device of claim 7, wherein the first and second detectors have capacitance values that are configured to change in response to the second and third cycle control signals, respectively.

10. The flash memory device of claim 7, wherein the first detector includes:
   a first transistor connected between a first power supply and a first node, the first transistor configured to be controlled by the first feedback signal;
   a second transistor connected to the first node and coupled in series with the first transistor, the second transistor configured to be controlled by the first feedback signal;
   a third transistor connected in series between the second transistor and a second supply voltage, the third transistor configured to be controlled by the reference voltage;
   a first capacitor connected between the first node and the second power supply voltage;
   a fourth transistor connected to the first node, the fourth transistor configured to be controlled by the second cycle control signal; and
   a second capacitor connected in series between the fourth transistor and the second power supply voltage.

11. The flash memory device of claim 10, wherein the first transistor is a PMOS transistor, and wherein each of the second, third, and fourth transistors are NMOS transistors.

12. The flash memory device of claim 10, wherein the second detector includes:
   a fifth transistor connected between the first power supply and a second node, the fifth transistor configured to be controlled by the second feedback signal;
   a sixth transistor connected to the second node and coupled in series with the fifth transistor, the sixth transistor configured to be controlled by the second feedback signal;
   a seventh transistor connected in series between the sixth transistor and the second supply voltage, the seventh transistor controlled by the reference voltage;
   a third capacitor connected between the second node and the second power supply voltage;
   a eighth transistor connected to the second node, the eighth transistor configured to be controlled by the third cycle control signal; and
   a fourth capacitor connected in series between the fourth transistor and the second power supply voltage.

13. The flash memory device of claim 7, wherein the second detector has the same structure as the first detector.

14. The flash memory device of claim 7, wherein the reference voltage generator includes:
   a first transistor connected between a first power supply voltage and a first node, the first transistor configured to be controlled by an enable signal;
   a first resistor connected to the first node;
   a second resistor coupled between the first node and a second node;
   a second transistor connected in parallel with at least one of the first and second resistors, the second transistor configured to be controlled by the first cycle control signal; and
   a third transistor connected between the second node and a second power supply voltage, the third transistor configured to generate the reference voltage through a gate of the third transistor.

15. The flash memory device of claim 7, wherein the latch includes:
   a first NAND gate configured to receive the first comparison signal and the plurality of internal clock signals; and
   a second NAND gate coupled to the first NAND gate, the second NAND gate configured to receive an output of the first NAND gate and the second comparison signal, the second NAND gate configured to output the plurality of internal clock signals.

16. The flash memory device of claim 1, further comprising a voltage generation circuit configured to generate a high voltage by charge pumping in response to an oscillation signal, wherein the unified oscillation circuit is configured to generate the oscillation signal.

17. A flash memory device comprising:
   a memory cell array including electrically erasable programmable read-only memory (EEPROM) cells;
   a peripheral circuit coupled to the memory cell array and configured to perform program, erase, or read with respect to the memory cell array;
   a control circuit coupled to the peripheral circuit and configured to detect an operating mode based on an external control signal, the control circuit further configured to control the peripheral circuit according to the detected operating mode and to generate a cycle control signal; and
   a unified oscillation circuit coupled to the control circuit and configured to operate in response to the cycle control signal, the unified oscillation circuit further configured to selectively generate one of a plurality of internal clock signals based on the cycle control signal, wherein the unified oscillation circuit includes a ring oscillator having N delay elements connected in series, wherein an output signal of an N-th delay element is fed back to a first delay element as an input signal, wherein N is 3 or an odd number greater than 3, and wherein at least one of the N delay elements is controlled by the cycle control signal.

18. A method of operating a flash memory device, the method comprising:
   detecting one of a plurality of operating modes based on an external control signal;
   generating a cycle control signal according to the detected one of the plurality of operating modes; and
   generating an internal clock signal according to the cycle control signal, wherein generating the internal clock signal comprises;
      generating a reference voltage that changes amplitude according to the cycle control signal;
      generating a plurality of comparison signals that have different cycles respectively based on the cycle control signal and the reference voltage; and
      generating the internal clock signal based on the comparison signals.

19. The method of claim 18, wherein generating the cycle control signal comprises:
   storing cycle control information for each of the plurality of operating modes;
   generating a mode signal indicating the detected one of the plurality of operating modes; and
   generating the cycle control signal according to the stored cycle control information and the mode signal.

20. The method of claim 18, wherein generating the reference voltage comprises:
   generating a reference voltage having a voltage level that changes according to a first cycle control signal,
   wherein generating the plurality of comparison signals comprises;

generating a first detection signal that changes according to a first feedback signal, the reference voltage, and a second cycle control signal;

generating a second detection signal that changes according to a second feedback signal having a reverse phase to the first feedback signal, the reference voltage, and a third cycle control signal;

comparing the level of the reference voltage with a level of the first detection signal to output a first comparison signal;

comparing the level of the reference voltage with a level of the second detection signal to output a second comparison signal; and generating the internal clock signal comprises:
generating the first and second feedback signals and the internal clock signal using the first comparison signal and the second comparison signal,
wherein each of the first, second and third control signals comprises at least one bit of the cycle control signal.

* * * * *